(12) United States Patent
St. Germain et al.

(10) Patent No.: US 10,976,785 B1
(45) Date of Patent: Apr. 13, 2021

(54) PACKAGING OF VERTICALLY ORIENTED ORTHOGONALLY CONNECTED SYSTEMS

(71) Applicant: JABIL INC., St. Petersburg, FL (US)

(72) Inventors: Ronald E. St. Germain, Amesbury, MA (US); Fengquan Zheng, San Jose, CA (US)

(73) Assignee: JABIL INC., St. Petersburg, FL (US)

(*) Notice: Subject to any disclaimer, the term of this patent is extended or adjusted under 35 U.S.C. 154(b) by 0 days.

(21) Appl. No.: 16/829,693

(22) Filed: Mar. 25, 2020

Related U.S. Application Data

(63) Continuation of application No. 16/827,831, filed on Mar. 24, 2020.

(51) Int. Cl.
  *G06F 1/00* (2006.01)
  *G06F 1/18* (2006.01)
  *H05K 7/14* (2006.01)

(52) U.S. Cl.
  CPC ........... *G06F 1/186* (2013.01); *H05K 7/1409* (2013.01); *H05K 7/1418* (2013.01); *H05K 7/1461* (2013.01)

(58) Field of Classification Search
  CPC ..... G06F 1/186; G06F 1/189; H01R 12/7088; H05K 7/1431
  See application file for complete search history.

(56) References Cited

U.S. PATENT DOCUMENTS

| | | | | |
|---|---|---|---|---|
| 6,757,748 B1* | 6/2004 | Hipp | ....................... | G06F 1/183 |
| | | | | 370/419 |
| 7,075,796 B1* | 7/2006 | Pritchett | ................. | G06F 1/184 |
| | | | | 211/41.17 |
| 2002/0018339 A1* | 2/2002 | Uzuka | ..................... | H05K 1/14 |
| | | | | 361/796 |

* cited by examiner

*Primary Examiner* — Pete T Lee
(74) *Attorney, Agent, or Firm* — Shumaker, Loop & Kendrick, LLP; James D. Miller

(57) ABSTRACT

A computing system including a chassis and a canister slidably insertable within the chassis, where the canister includes first and second angled slots. A CPU module mounted within the canister includes a plurality of first connectors and a plurality of I/O modules are positioned within the chassis and include a second connector. A plurality of riser cards including a third connector coupled to a bottom edge and a fourth connector coupled to a rear edge, where the third connector on each riser card is connected to one of the first connectors and the fourth connector on each riser card is connected to one of the second connectors. Actuation of ejector levers pivotally mounted to the bottom panel of the chassis cause pins to move in the angled slots and the canister to move relative to the chassis so as to connect and disconnect the second and fourth connectors.

18 Claims, 24 Drawing Sheets

PACKAGING OF VERTICALLY ORIENTED ORTHOGONALLY CONNECTED SYSTEMS

CROSS-REFERENCE TO RELATED APPLICATIONS

This application is a continuation application of U.S. application Ser. No. 16/827,831, titled Orthogonal Structure With Riser Card, filed Mar. 24, 2020.

BACKGROUND

Field

This disclosure relates generally to a computing system and, more particularly, to a computing system that includes various features that allow a removable canister holding a CPU module to easily be slid into and slid out of a chassis to connect and disconnect the CPU module to a plurality of I/O modules.

Discussion of the Related Art

A typical computing system includes a motherboard or central processing (CPU) module that provides the computing and processing for the system and multiple input/output (I/O) modules that connect the CPU module to other computing systems through a peripheral component interconnect express (PCIe) bus or other similar high-speed buses. Modern computing systems of this type generally support the hot-swapping of a failed I/O module, i.e. replacing the failed I/O module while the system is operating, where certain system level features are required to accomplish such a hot-swap. One design feature that allows hot swapping is to provide a midplane that is generally a board including separate connectors for connecting the I/O modules to the CPU module. Another design feature that allows hot swapping of I/O modules includes using a separate orthogonal connector for each I/O module that all may be part of a common midplane or be separate units. However, known midplanes can be very complex often including twelve or more layers providing numerous signal paths for connecting the I/O modules to the CPU module. Further, the orthogonal connectors provide good signal quality, but because of their orthogonal design may not provide enough pins for higher speed buses, and are costly.

As the industry moves from PCIe Gen 4 (16 GT/s) to PCIe Gen 5 (32 GT/s) protocols and higher, these increased speeds will require more traces with larger and higher pin count connectors that will occupy more space on the midplane, thus creating a more costly higher layer count construction. Higher speed solutions consume more power and require additional and shorter traces. This combination of more traces and higher power dissipation will be a challenge for providing adequate venting for cooling of the CPU module when employing known midplanes because these midplanes block airflow and reduce thermal performance.

SUMMARY

The following discussion discloses and describes a computing system including a housing assembly having a chassis with a bottom panel and canister slidably insertable within the chassis, where the canister includes a bottom panel having a rear edge and the bottom panel of the canister includes first and second angled slots that are open to the rear edge. The system also includes a central processing unit (CPU) module mounted within the canister and including a plurality of first input/output (I/O) connectors and a plurality of I/O modules positioned within the chassis, where each I/O module includes a second I/O connector. The system further includes a plurality of I/O riser cards each including a printed circuit board (PCB) having opposing side surfaces, a front edge, a rear edge, a top edge, a bottom edge, a third I/O connector coupled to the bottom edge and a fourth I/O connector coupled to the rear edge, where the third I/O connector on each I/O riser card is connected to one of the first I/O connectors and the fourth I/O connector on each I/O riser card is connected to one of the second I/O connectors so that the I/O riser cards are vertically oriented in parallel. First and second ejector levers are pivotally mounted to the bottom panel of the chassis on first and second pins and are positioned between the bottom panels of the chassis and the canister. Actuation of the first and second levers cause the pins to move in the angled slots and the canister to move relative to the chassis so as to connect and disconnect the second and fourth I/O connectors.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a computing system that includes various features that allow a removable canister holding a CPU module to easily be slid into and slid out of a chassis to connect and disconnect the CPU module to a plurality of I/O modules is merely exemplary in nature, and is in no way intended to limit the disclosure or its applications or uses.

Figure 1:
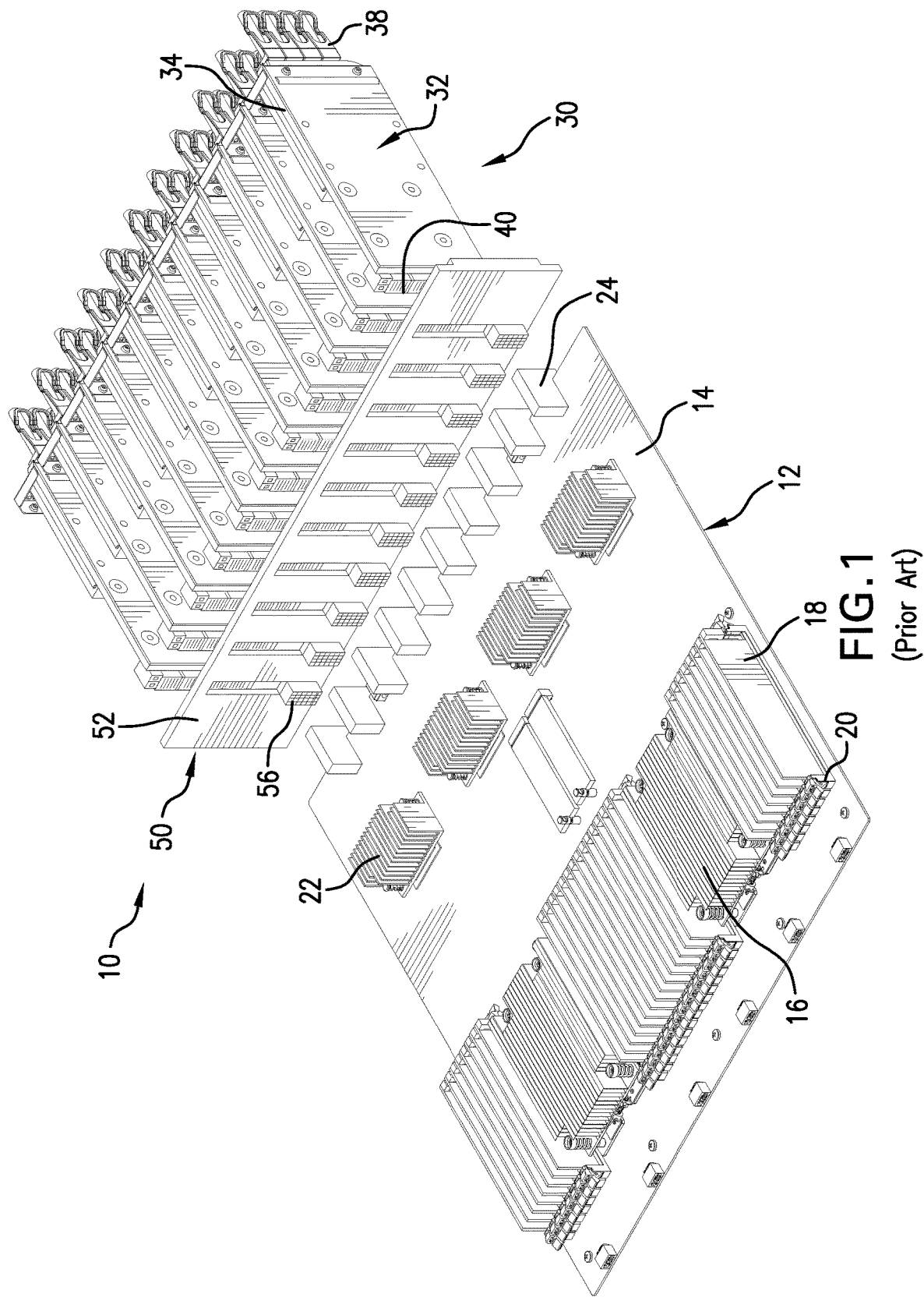
FIG. 1 is an exploded, front isometric view of a known computing system including a midplane that provides an electrical connection between I/O modules and a CPU module.
Figure 2:
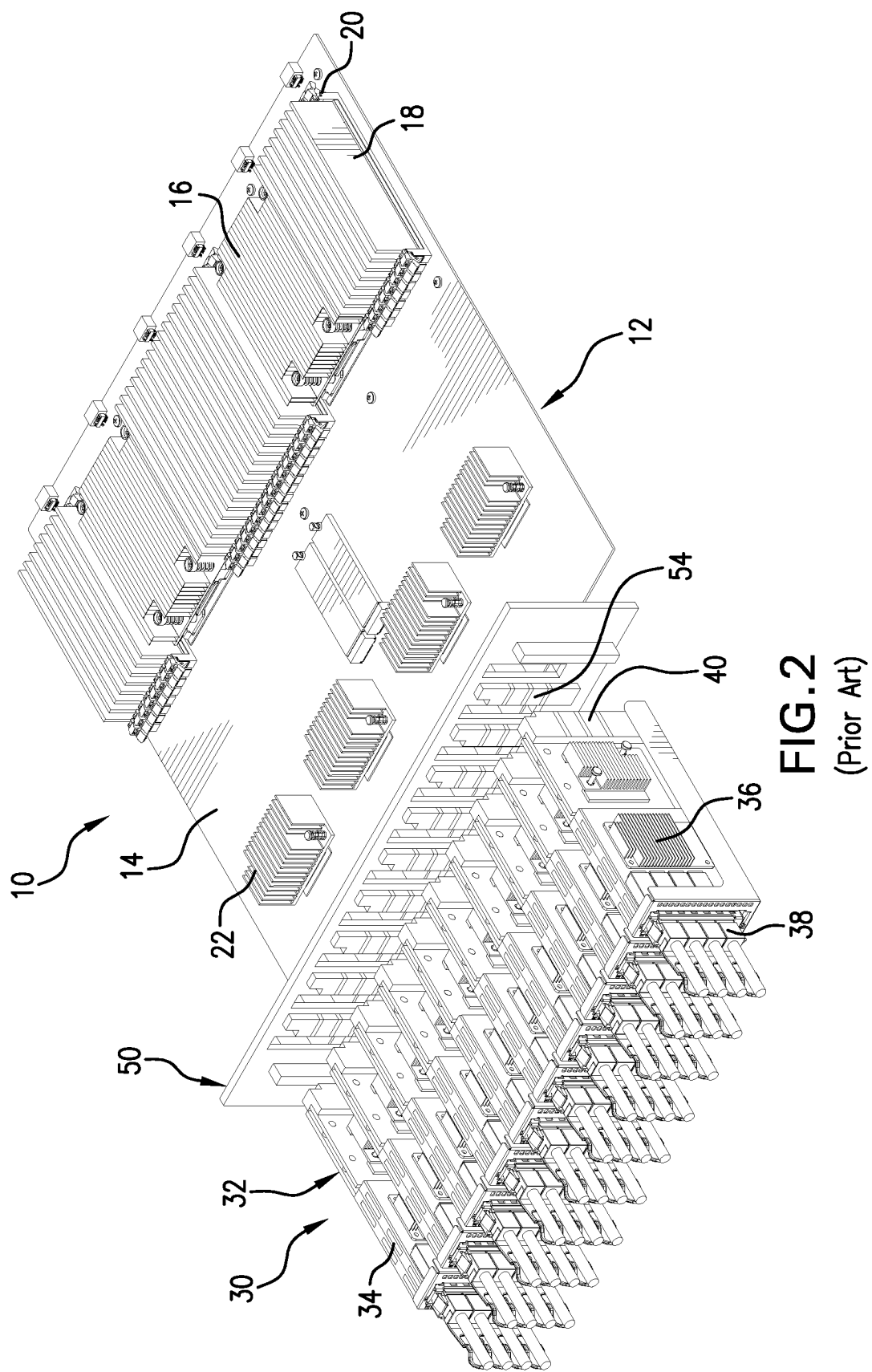
FIG. 2 is an exploded, rear isometric view of the computing system shown in FIG. 1.

FIG. 1 is an exploded, front isometric view and FIG. 2 is an exploded rear, isometric view of a known computing system 10, where an outer chassis of the system 10 has been removed. The computing system 10 is intended to represent any computer, server, etc. that performs any computing function or operation consistent with the discussion herein and operates using any suitable protocol, such as peripheral component interconnect express (PCIe) Gen 4 (16 GT/s), PCIe Gen 5 (32 GT/s), open coherent accelerator processor interface (OpenCAPI), Gen-Z, cache coherent interconnect for accelerators (CCIX), and compute express link (CXL). The system 10 includes a CPU module 12 having a printed circuit board (PCB) 14 on which is mounted CPUs 16 having heat sinks, memory modules 18 coupled in slots 20, heat sinks 22 and I/O connectors 24. The system 10 also includes an I/O module assembly 30 having a number of I/O modules 32 each including a PCB 34 on which are mounted module components 36, connectors 38 that are connected to other computing systems and components (not shown) by wires, and connectors 40 for connecting the I/O module 32 to the CPU module 12. The system 10 further includes a midplane 50 of the type discussed above for connecting the I/O modules 32 to the CPU module 12 and including a PCB 52, a number of connectors 54 on one side of the PCB 52 that connect to the connectors 40 and a number of connectors 56 on the other side of the PCB 52 that connect to the connectors 24. As discussed above, use of the midplane 50 for connecting the I/O modules 32 to the CPU module 12 allows hot swapping of the I/O modules 32, but limits the airflow through the system 10, and thus the cooling capability.

Figure 3:
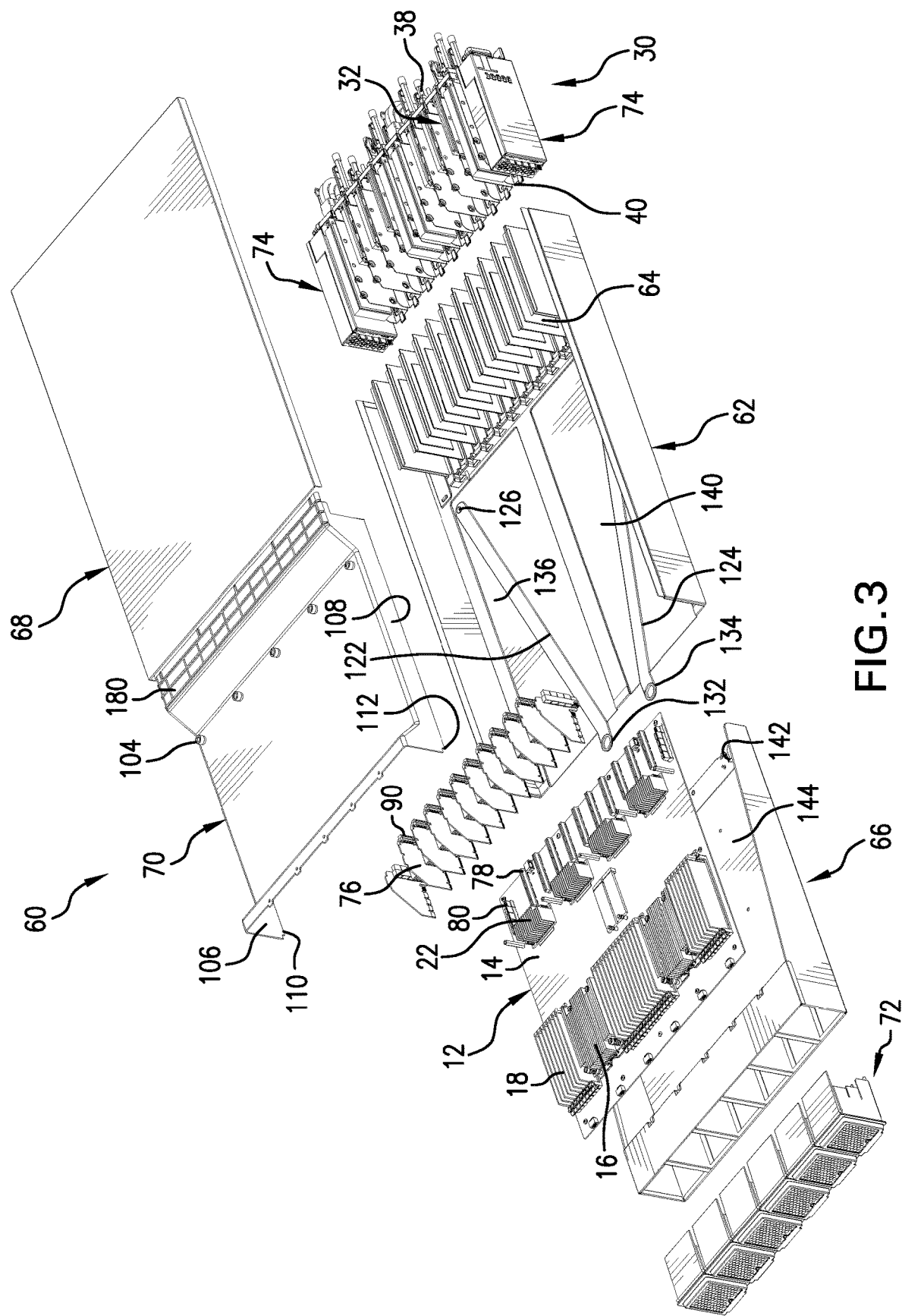
FIG. 3 is an exploded, front isometric view of a computing system including riser cards that replace the midplane in the computing system shown in FIG. 1 and provide a connection between the CPU module and the I/O modules.
Figure 4:
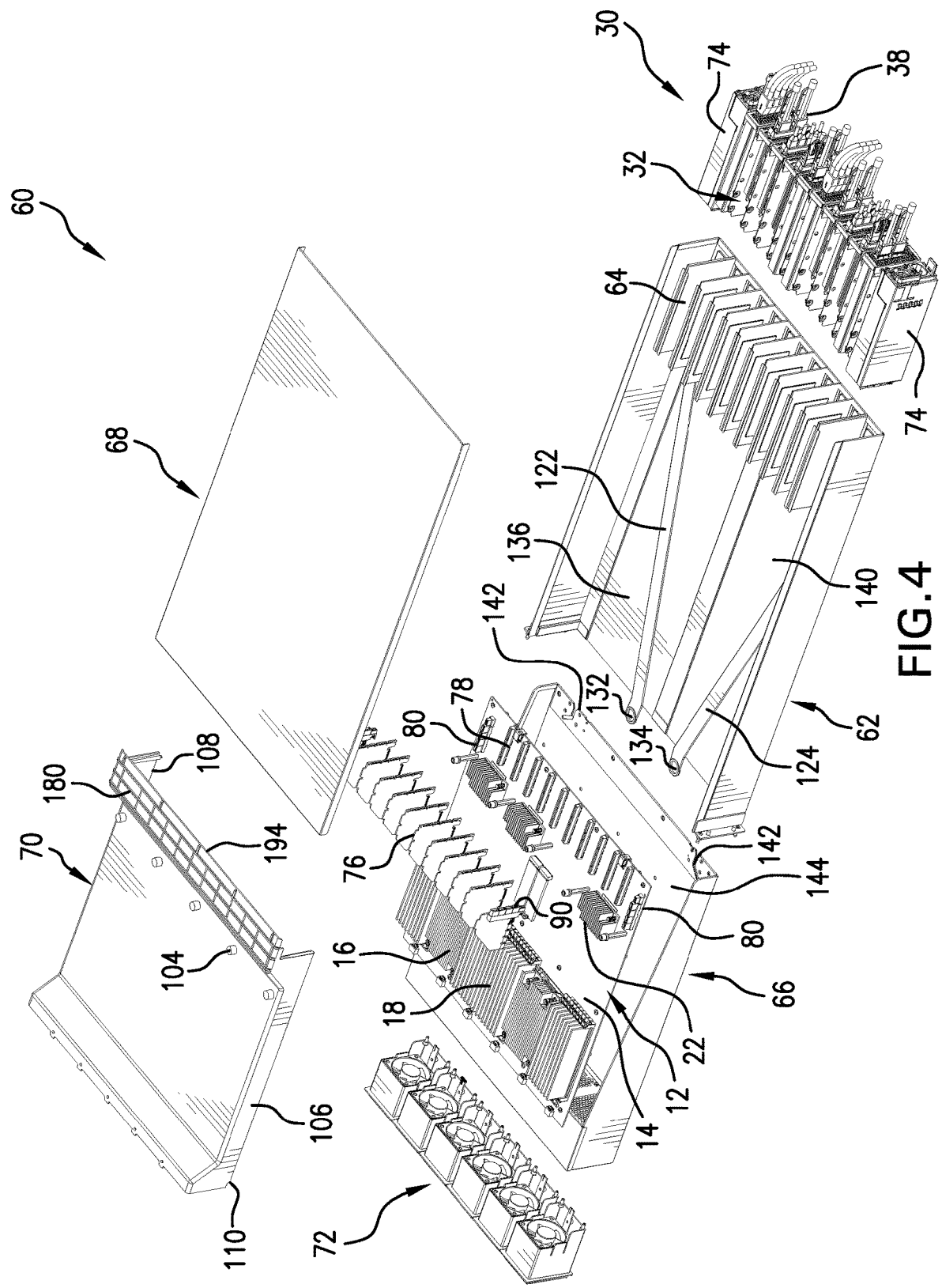
FIG. 4 is an exploded, rear isometric view of the computing system shown in FIG. 3.
Figure 5:
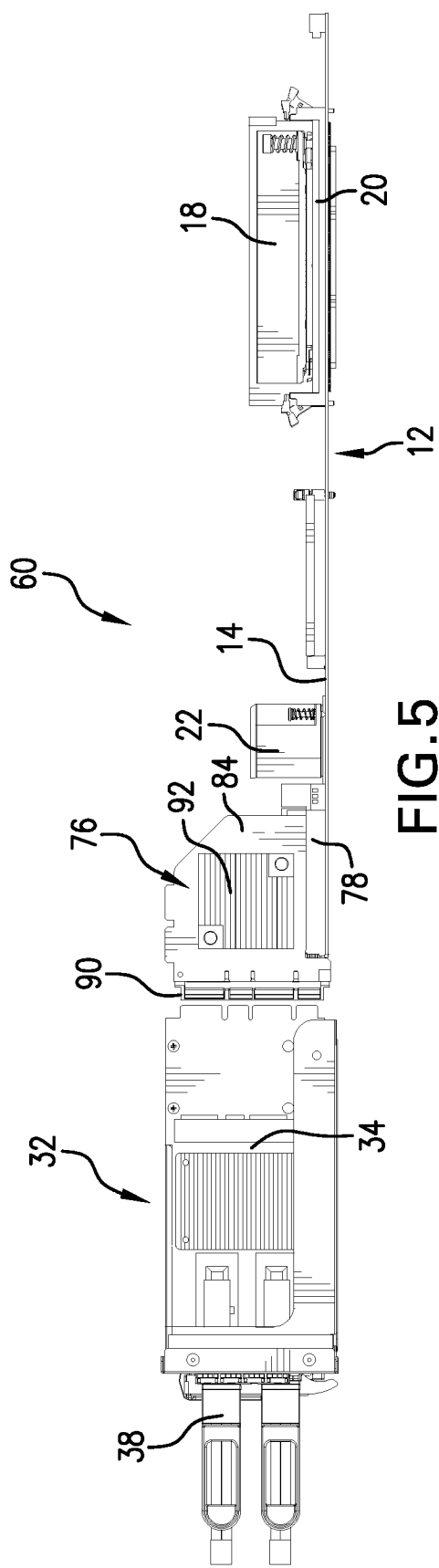
FIG. 5 is a side view of the computing system shown in FIG. 3 with the outer chassis removed.

FIG. 3 is an exploded front isometric view and FIG. 4 is an exploded rear isometric view of a computing system 60 that is similar to the computing system 10, but does not require the midplane 50, where like elements are identified by the same reference number. The system 60 includes an outer chassis 62 having slots 64 for accepting the I/O modules 32, a CPU canister 66 for holding the CPU module 12 that replaces the CPU module 12 and that is slid into the chassis 62, a top cover 68, an air duct cover 70, a cooling fan assembly 72 mounted to a front of the CPU canister 66 and a pair of power supply units (PSUs) 74 also slid into the slots 64, where the system 10 would also include these elements for the embodiments shown. FIG. 5 is a side view of the system 60 with the chassis 62, the canister 66 and the covers 68 and 70 removed.

Figure 6:
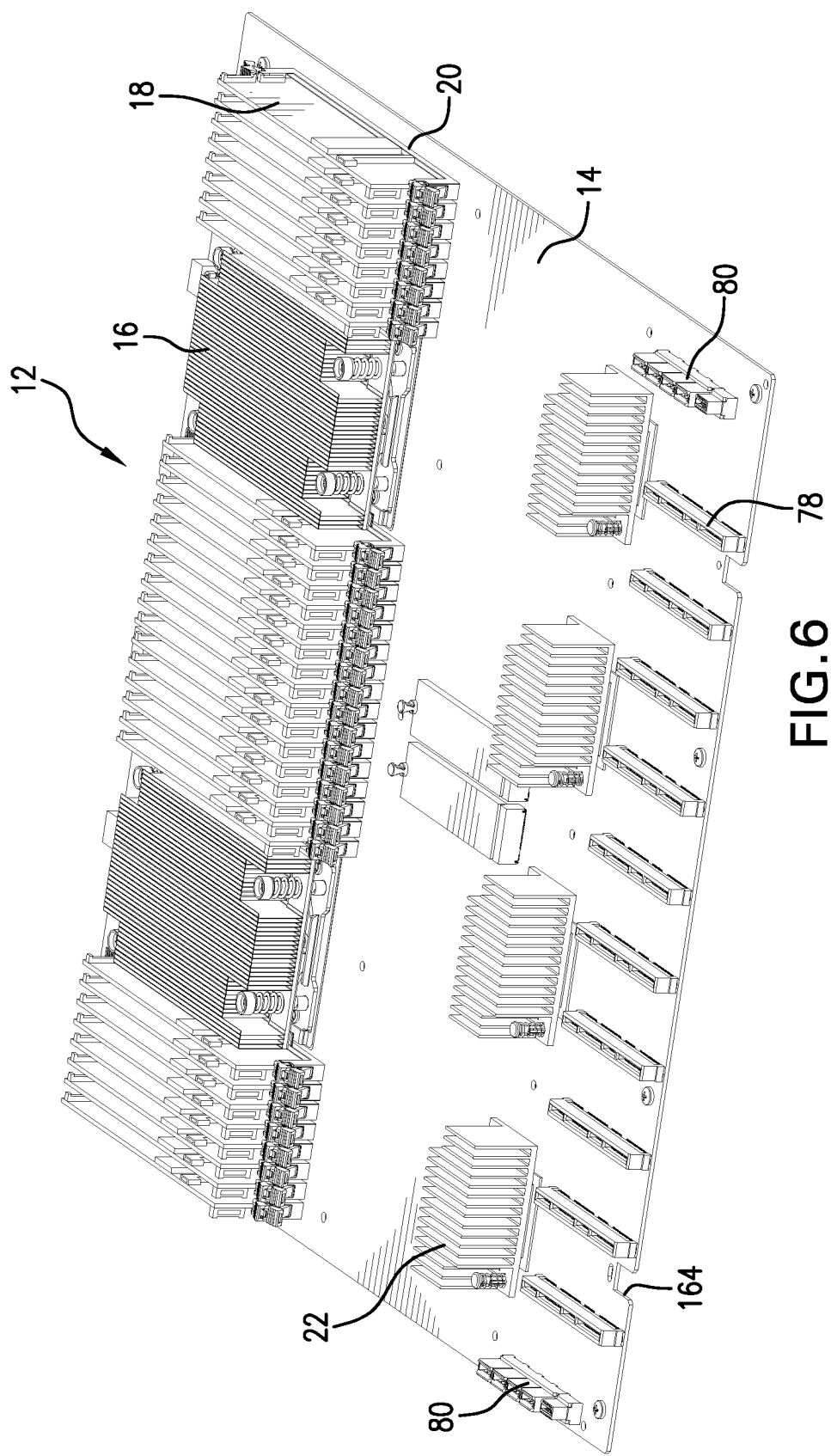
FIG. 6 is a rear isometric view of a CPU module separated from the computing system shown in FIG. 3.
Figure 7:
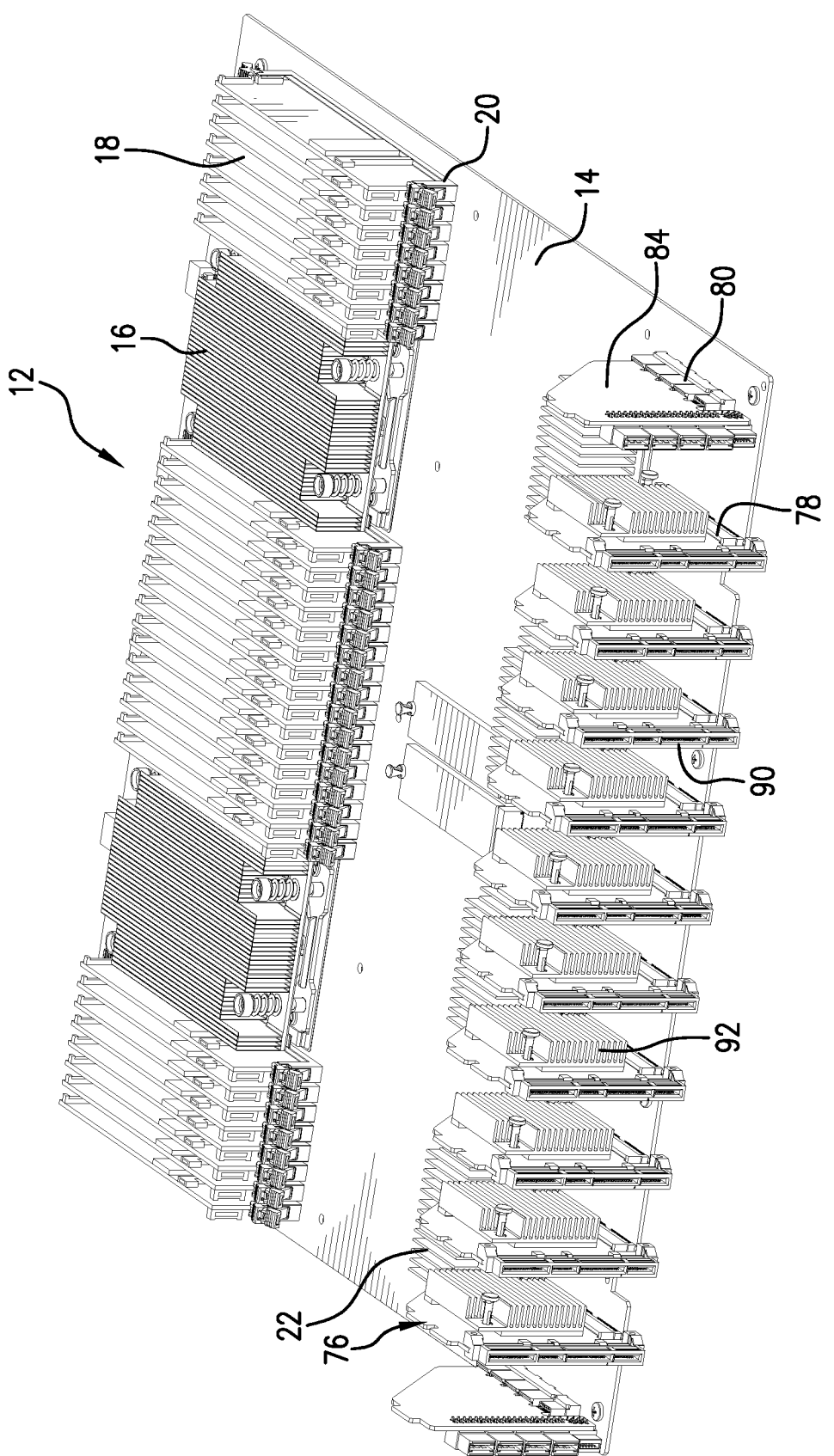
FIG. 7 is a rear isometric view of the CPU module shown in FIG. 6 illustrating the riser cards inserted into I/O connectors.
Figure 8:
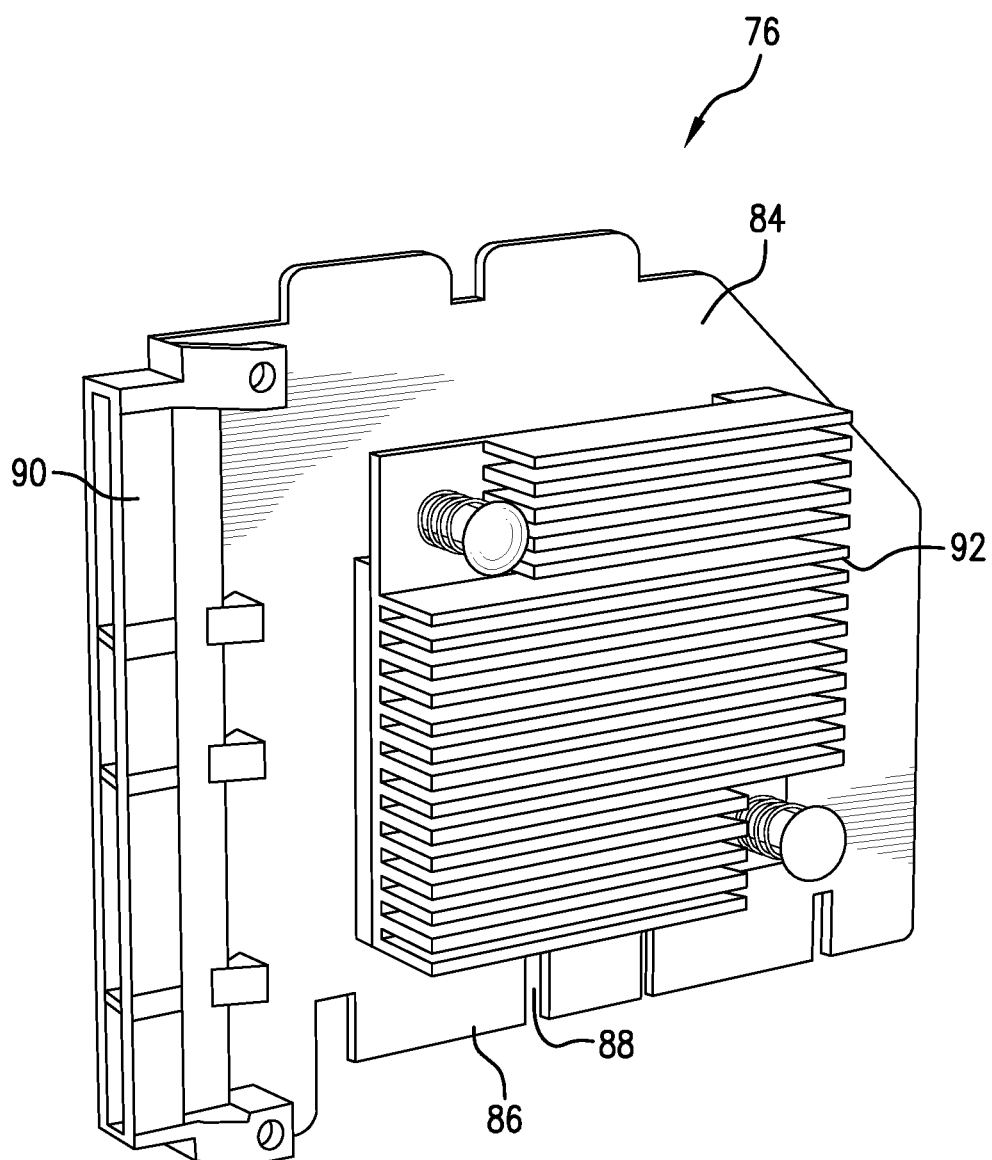
FIG. 8 is an isometric view of one of the riser cards separated from the CPU module shown in FIG. 7.
Figure 9:
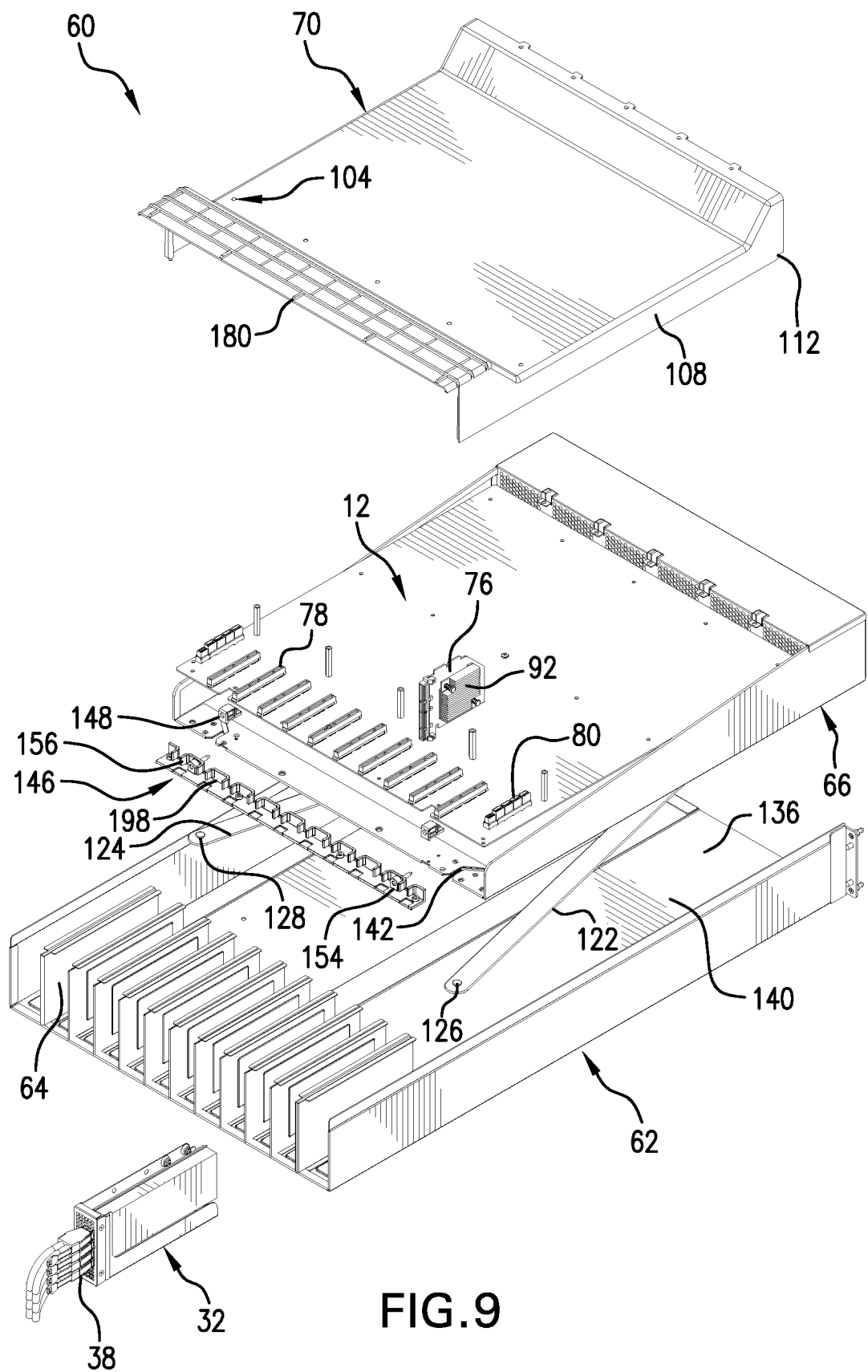
FIG. 9 is a partial, exploded, rear, isometric view of the computing system shown in FIG. 3 including various elements for aligning and inserting a CPU canister.
Figure 10:
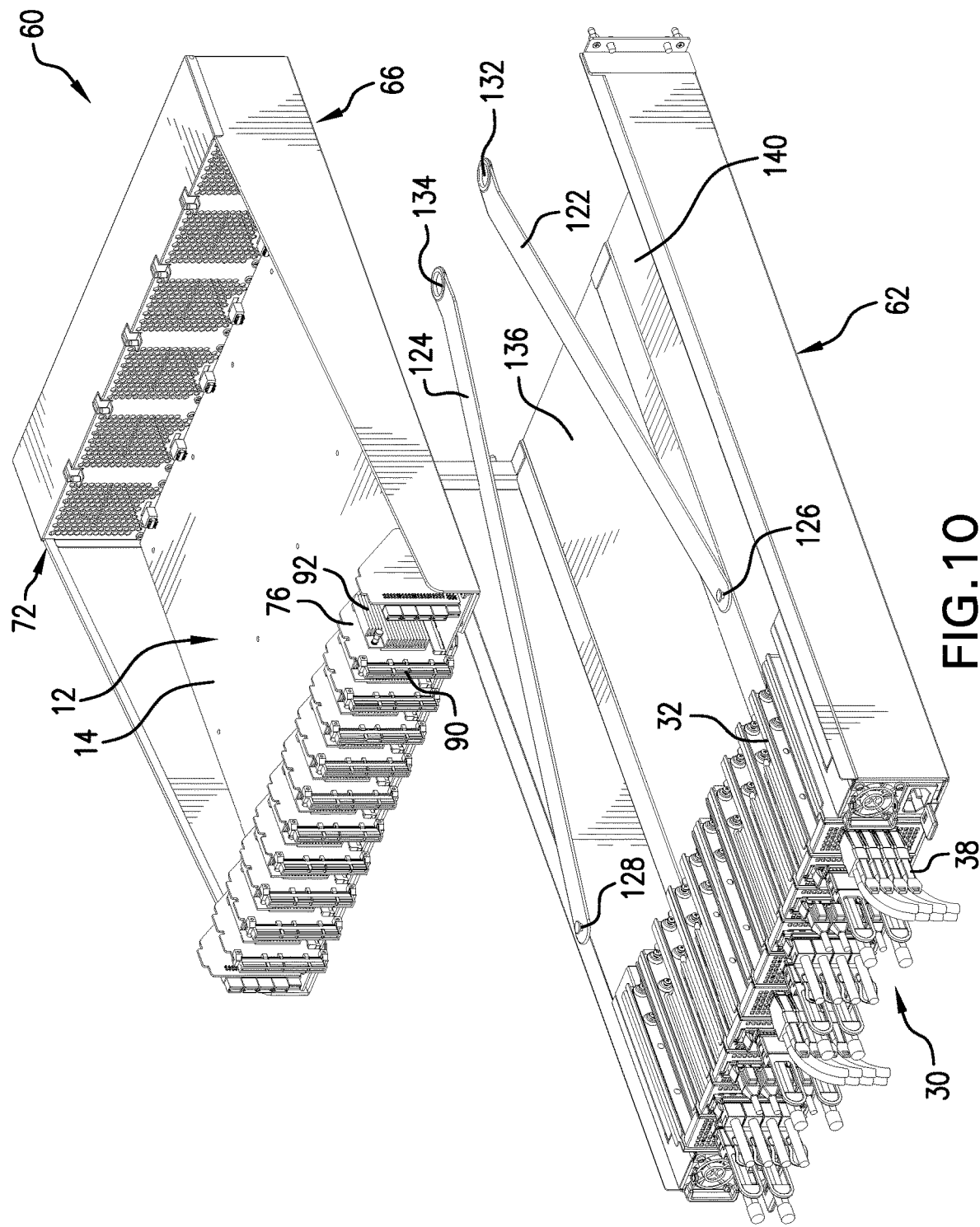
FIG. 10 is a partial, exploded, rear, isometric view of the computing system shown in FIG. 3 illustrating a pair of ejector levers.
Figure 11:
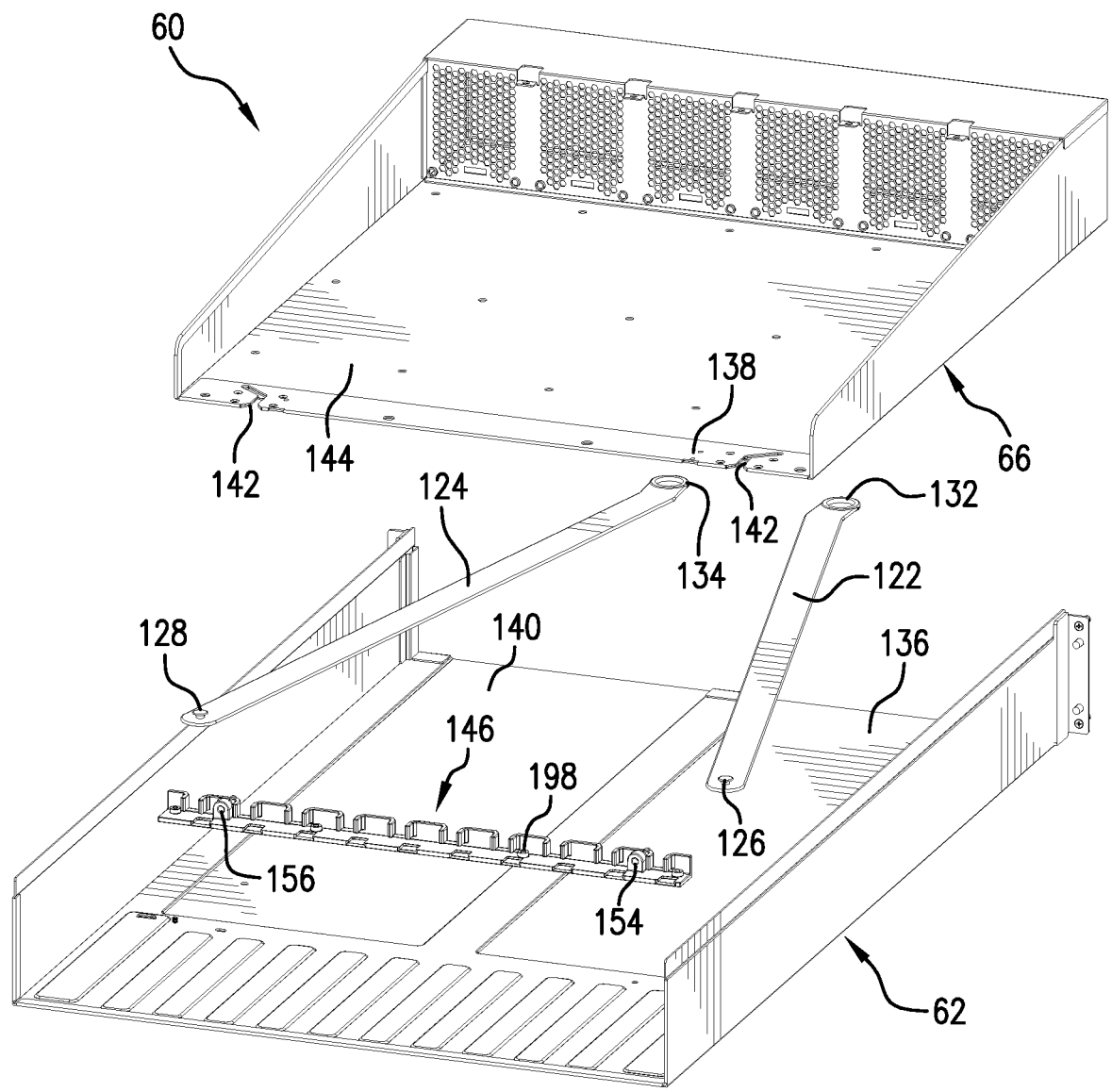
FIG. 11 is a partial, exploded, rear, isometric view of the computing system shown in FIG. 3 illustrating the ejector levers and a guide bar.

As will be discussed in detail below, the computing system 60 employs a number of orthogonal riser cards 76, one for each of the I/O modules 32 and the PSUs 74, that connect the I/O modules 32 and the PSUs 74 to the CPU module 12. FIG. 6 is an isometric view of the CPU module 12 separated from system 60 and showing I/O connectors 78 and PSU connectors 80 to which the riser cards 76 are connected. FIG. 7 is an isometric view of the CPU module 12 separated from the system 60 and showing the riser cards 76 inserted into the connectors 78 and 80. FIG. 8 is an isometric view of one of the riser cards 76 separated from the CPU module 12.

The riser cards 76 include a PCB 84 having the general shape as shown. A bottom edge of the riser card 76 includes a number of connector tabs 86 separated by slots 88, where the tabs 86 slide into the connectors 78 or 80. An interface connector 90 is mounted to a rear edge of the riser card 76 and is configured to connect to the connector 40 on the I/O module 32. In this configuration, the riser cards 76 are vertically oriented and aligned lengthwise, i.e., parallel, with the flow of air through the canister 66 and the chassis 62 where there is significant space between the riser cards 76 that allow for increased airflow. Additionally, this configuration simplifies routing, reduces complexity, and allows a much higher I/O pin count.

As the computing systems become more complex and operate at faster speeds where signal lengths and integrity become more critical, some of the I/O modules 32 may be more critical than others of the I/O modules 32. It may be desirable for some of these I/O modules 32 to employ a retimer circuit 92, which is a mixed-signal device that includes equalization functions plus a clock data recovery (CDR) function to compensate both deterministic and random jitter, which can be mounted to the PCB 84. Thus, some of the riser cards 76 may include a retimer circuit 92 and some may not.

With the implementation of the vertically oriented riser cards 76 as described, a number of challenges have been identified to provide adequate system packaging. For example, how to install, support and align all of the I/O modules 32 within the CPU canister 66; how to guarantee that the I/O modules 32 being inserted from the rear of the system 60 properly align with the I/O interface cards on the CPU canister 66; how to overcome the insertion and extraction forces associated with the CPU canister 66 with its various I/O connectors trying to insert and extract at the same time when installing the CPU canister 66; how to keep the I/O modules 32 from extracting out of the front of the system 60 while the CPU canister 66 is being extracted, and how to control the insertion depth of the CPU canister 66 and the I/O modules 32 in order to have a solid and reliable interface between the I/O modules 32 and the CPU canister 66. More specifically, when the canister 66 is slid into the chassis 62 from the front, it is necessary that all of the riser cards 76 properly align with the I/O modules 32 and be able to withstand the insertion pressure, and it is necessary that too much force isn't required to remove the canister 66 from the chassis 62.

FIGS. 9, 10, 11 and 12 are partial, exploded isometric views of the computing system 60 illustrating various features that solve the problems referred to above. Particularly, as will be discussed, the computing system 60 includes interconnected features and elements that allow the canister 66 to be easily inserted into the chassis 62 so that the connectors 90 on the riser cards 76 are accurately aligned with the connectors 40 on the I/O modules 32 and can be easily coupled together, and allow the canister 66 to be slid out of the chassis 62 so that the connectors 40 and 90 easily disconnect. The air duct cover 70 is secured to the CPU canister 66 by thumb screws 104. Side walls 106 and 108 of the air duct cover 102 include notches 110 and 112, respectively, that fit into alignment holes on the PCB 14 so that the air duct cover 70 is aligned to the PCB 14 for proper alignment of the riser cards 76 for reasons that will become apparent from the discussion below.

Figure 12:
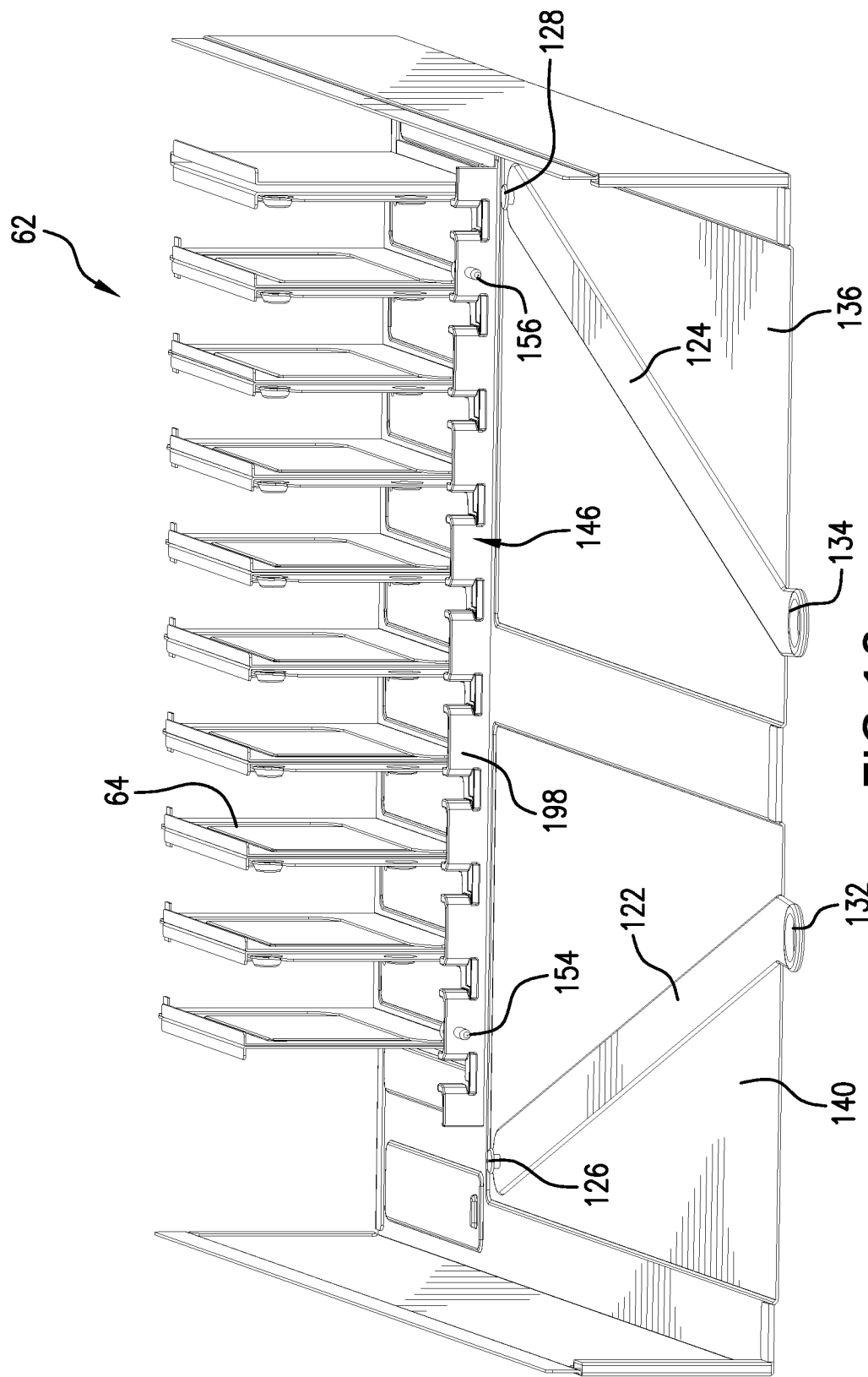
FIG. 12 is a front isometric view of the chassis separated from the computing system shown in FIG. 3 illustrating the ejector levers and the guide bar.
Figure 13:
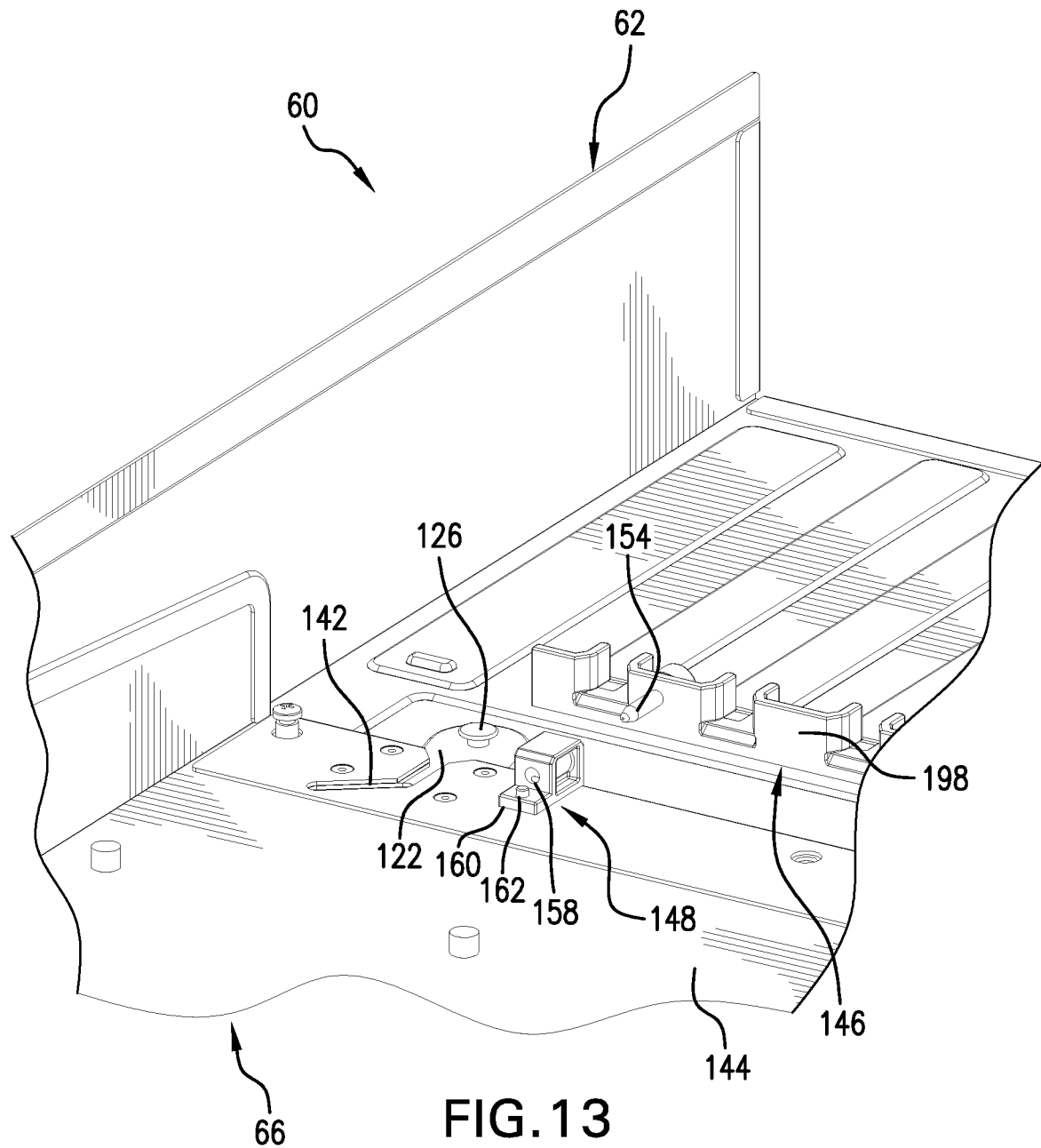
FIG. 13 is a partial, cut-away isometric view of the computing system shown in FIG. 9 illustrating a canister slot relative to a lever pin.

A pair of ejector levers 122 and 124 guide and control the insertion and extraction of the canister 66 into and out of the chassis 62 and provide the mechanical force to engage and disengage the canister 66 from all of the I/O modules 32 at the same time. More particularly, someone can pivotally separate the levers 122 and 124, which will disengage the canister 66 from the I/O modules 32. The levers 122 and 124 include cam pins 126 and 128, respectively, at one end and holding rings 132 and 134, respectively, at an opposite end, where the cam pins 126 and 128 are rotatably secured to a bottom panel 136 of the chassis 62. FIG. 12 shows the ejector levers 122 and 124 positioned in an emboss 140 in the bottom panel 136 of the chassis 62, which allows the levers 122 and 124 to pivot freely under the canister 66. FIG. 13 shows the canister 66 being slid into the chassis 62, where two angled lead-in slots 142 in a bottom panel 144 of the canister 66 are aligned with the pins 126 and 128. The slots 142 are configured so that when the levers 122 and 124 are in this position, the canister 66 can be inserted deep enough into the chassis 62 to allow the pins 126 and 128 to engage the slots 142, but not allow the CPU module 12 to engage the I/O modules 32.

Figure 14:
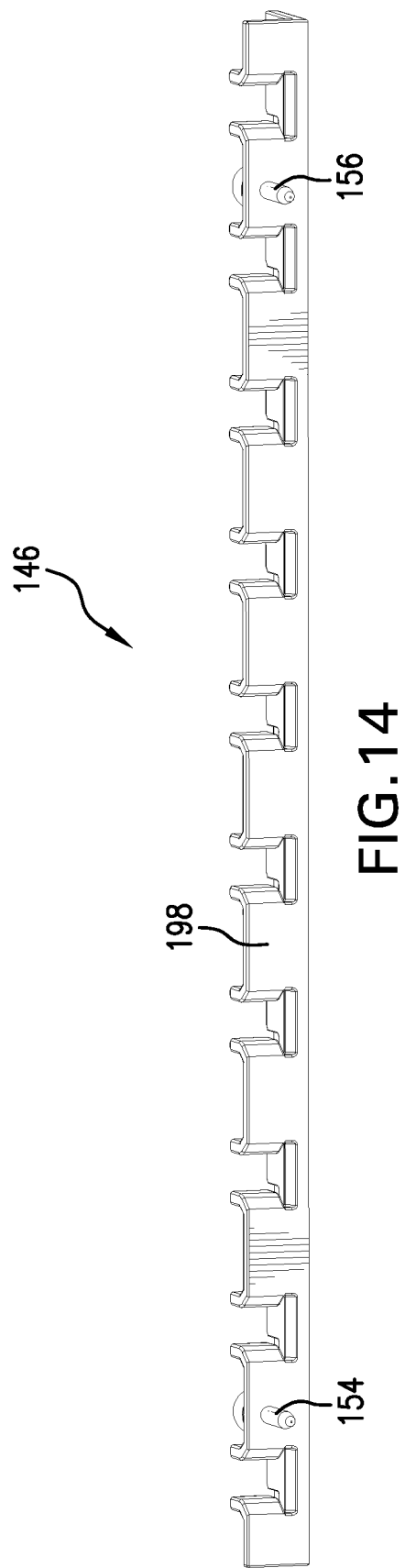
FIG. 14 is an isometric view of the guide bar separated from the computing system shown in FIG. 3.
Figure 15:
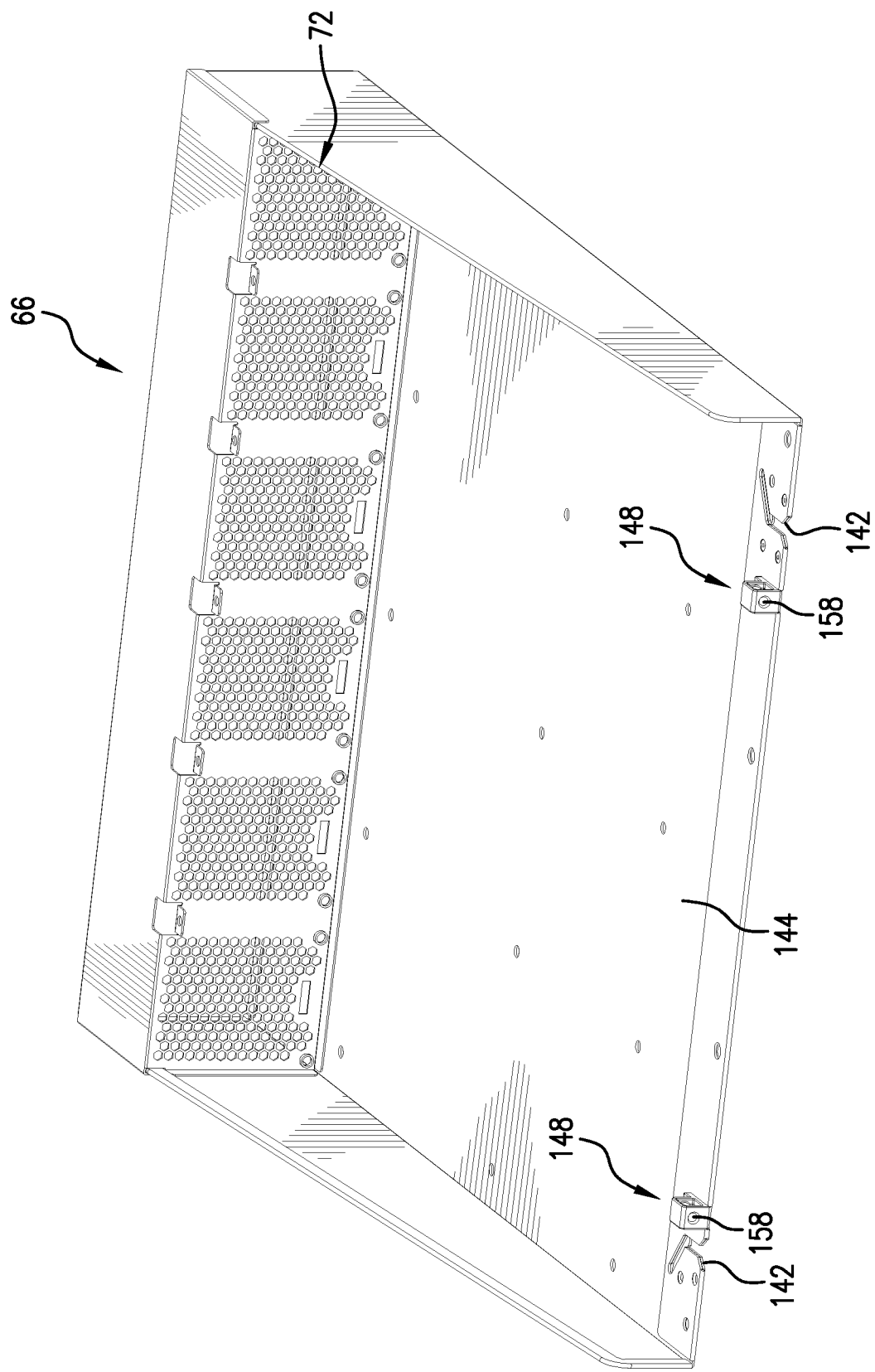
FIG. 15 is a rear isometric view of a canister separated from the computing system shown in FIG. 3.
Figure 16:
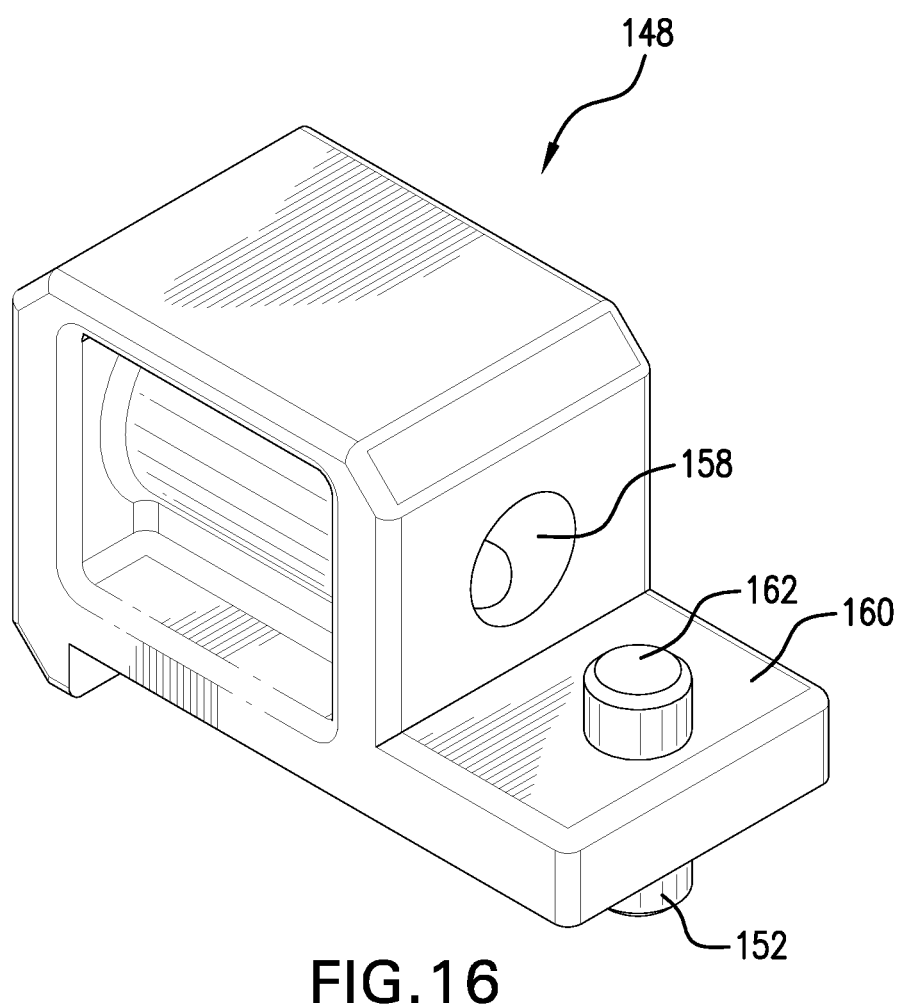
FIGS. 16-18 are isometric views of a guide block separated from the computing system shown in FIG. 3.
Figure 17:
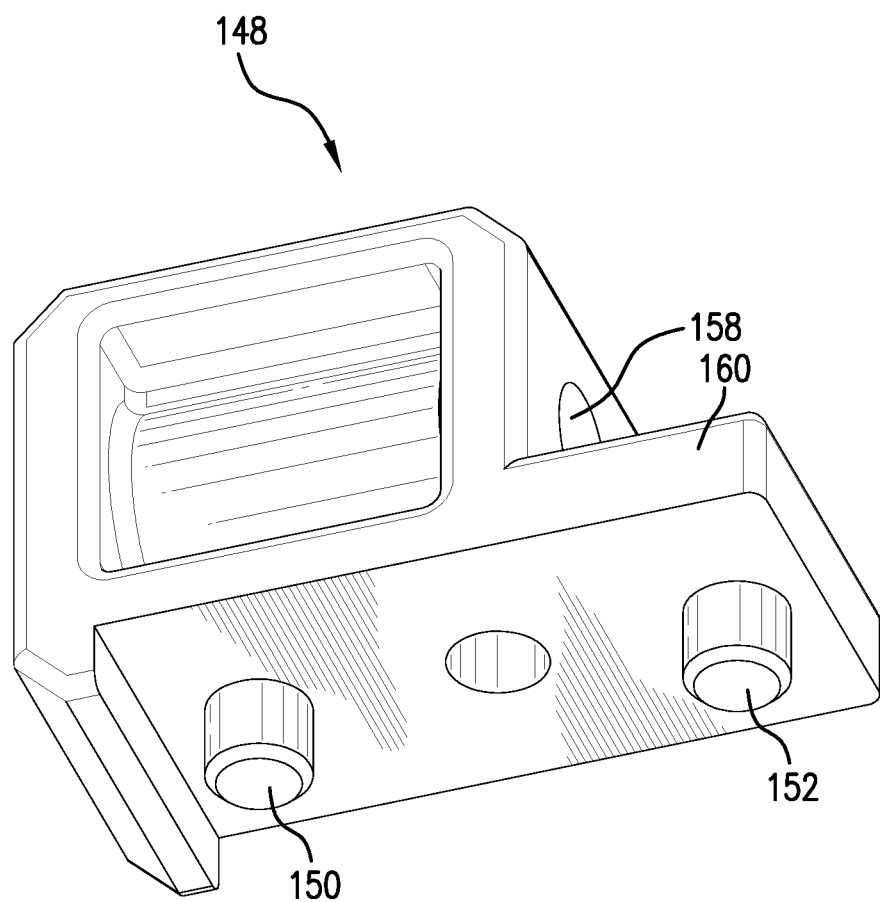
Figure 18:
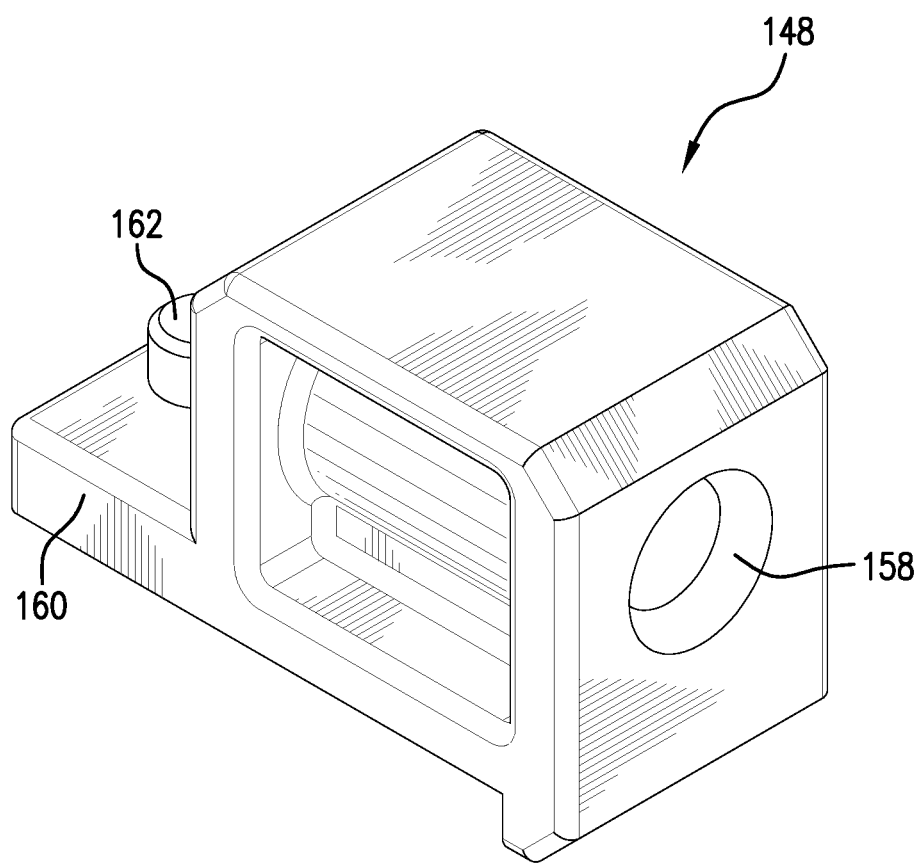
Figure 19:
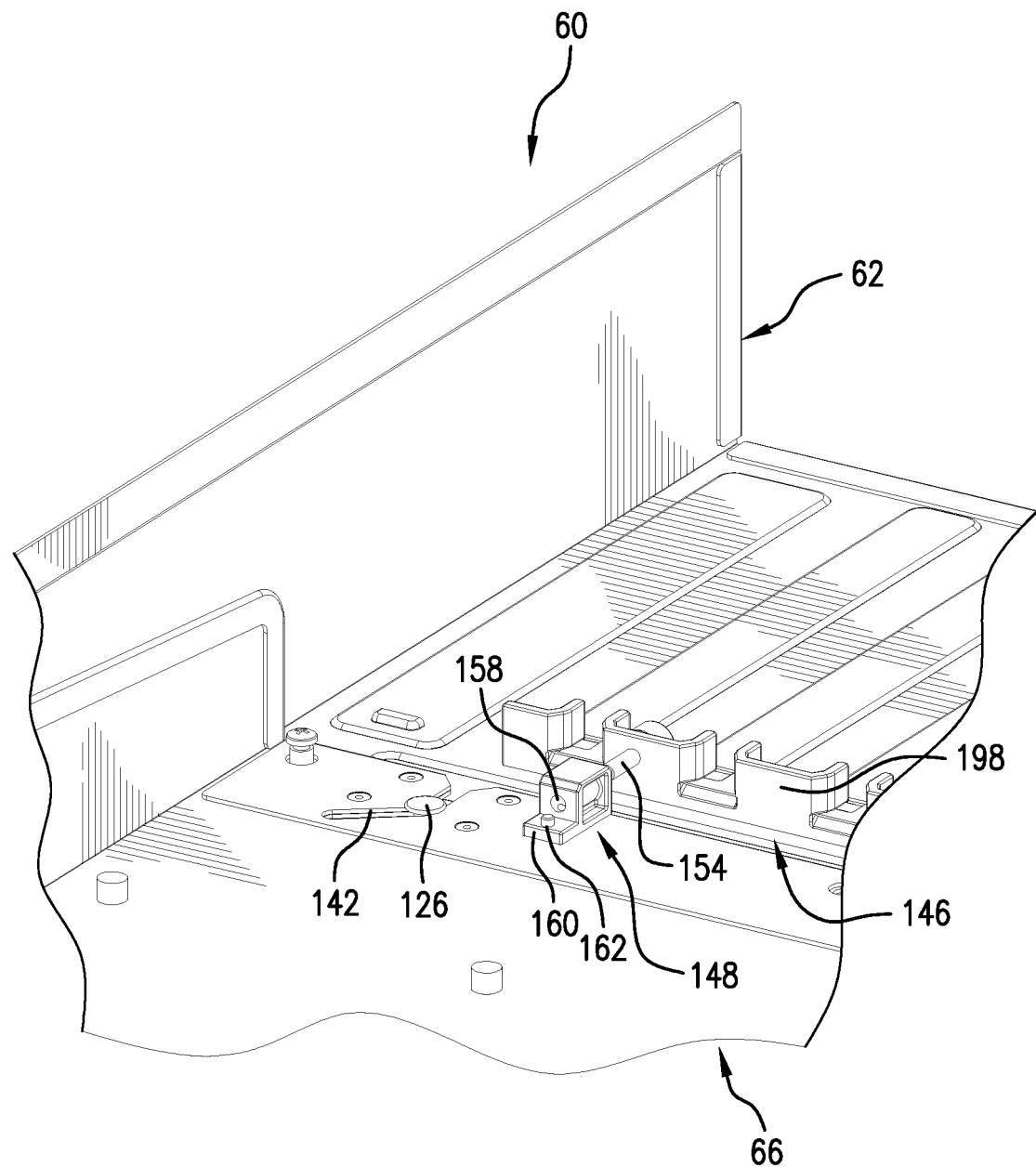
FIG. 19 is a partial, cut-away isometric view of the computing system shown in FIG. 3 illustrating a lever pin engaging a slot.
Figure 20:
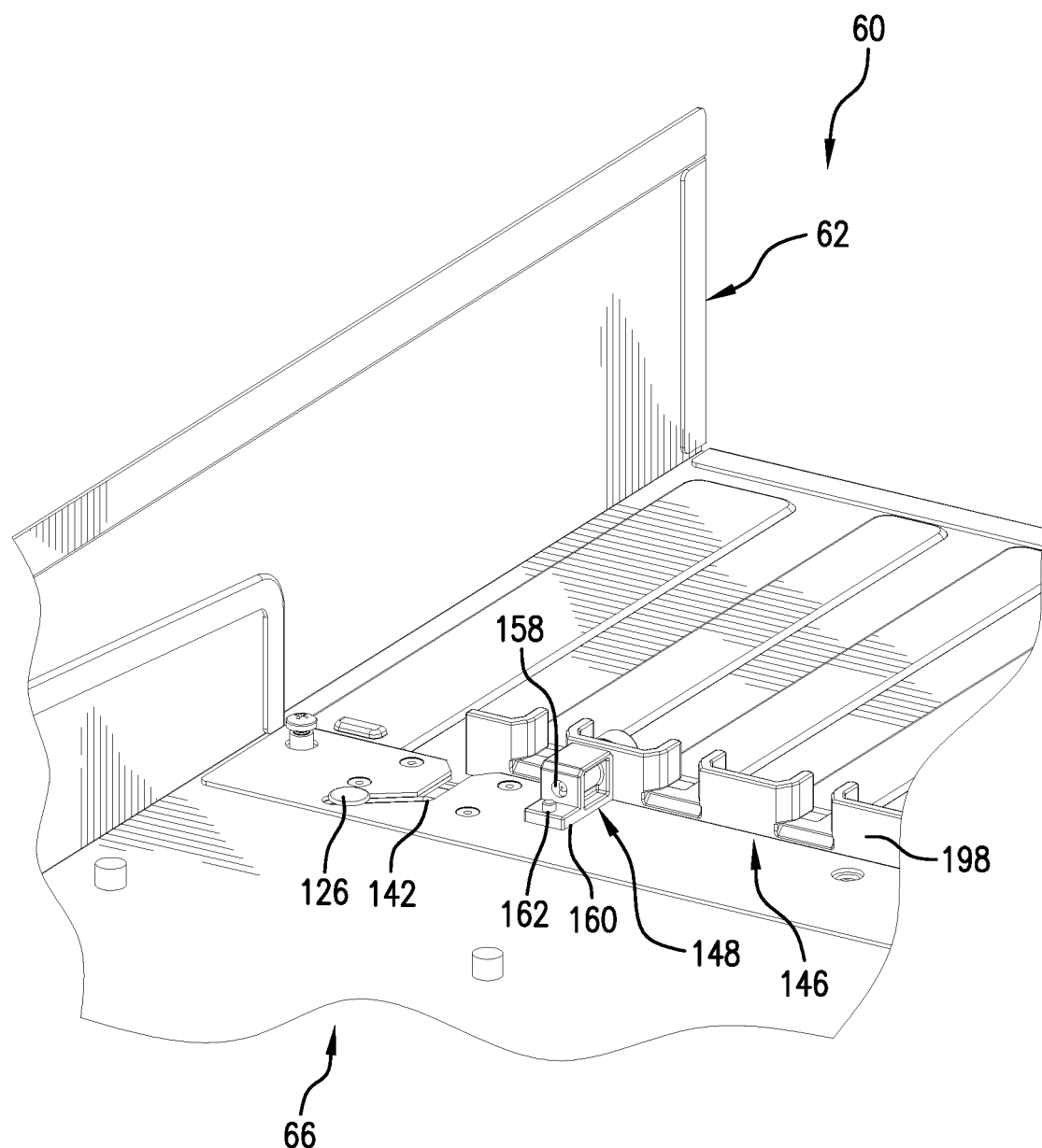
FIG. 20 is a partial, cut-away isometric view of the computing system shown in FIG. 3 illustrating the lever pin all of the way engaged within the slot.

A guide bar 146 is mounted to the bottom panel 136 in front of the slots 64 and two spaced apart guide blocks 148 are mounted to a back edge of the bottom panel 144 of the canister 66 by mounting pins 150 and 152 positioned within drilled holes 138 in the panel 144 proximate the slots 122, as shown. FIG. 14 is an isometric view of the guide bar 146 separated from the system 60, FIG. 15 is a back isometric view of the canister 66 separated from the system 60, and FIGS. 16, 17 and 18 are isometric views of one of the guide blocks 148 separated from the system 60. FIG. 19 shows the pin 126 initially engaged in the slot 142 so that guide pins 154 and 156 on the guide bar 146 are aligned with an opening 158 in the guide blocks 148, where the canister 66 cannot engage the I/O connectors 40 without pivoting the levers 122 and 124. FIG. 20 shows the levers 122 and 124 after being pivoted so that the pins 126 and 128 are driven into the angled portion of the slots 142, which drives the canister 66 backwards so that the opening 158 in the guide blocks 148 engage the pins 154 and 156, the rear edge of the canister 66 is positioned against the guide bar 146 and the connectors 90 engage the connectors 40 on the I/O modules 32. The CPU module 12 is disconnected from the I/O modules 32 by pivoting the levers 122 and 124 in the opposite direction.

Figure 21:
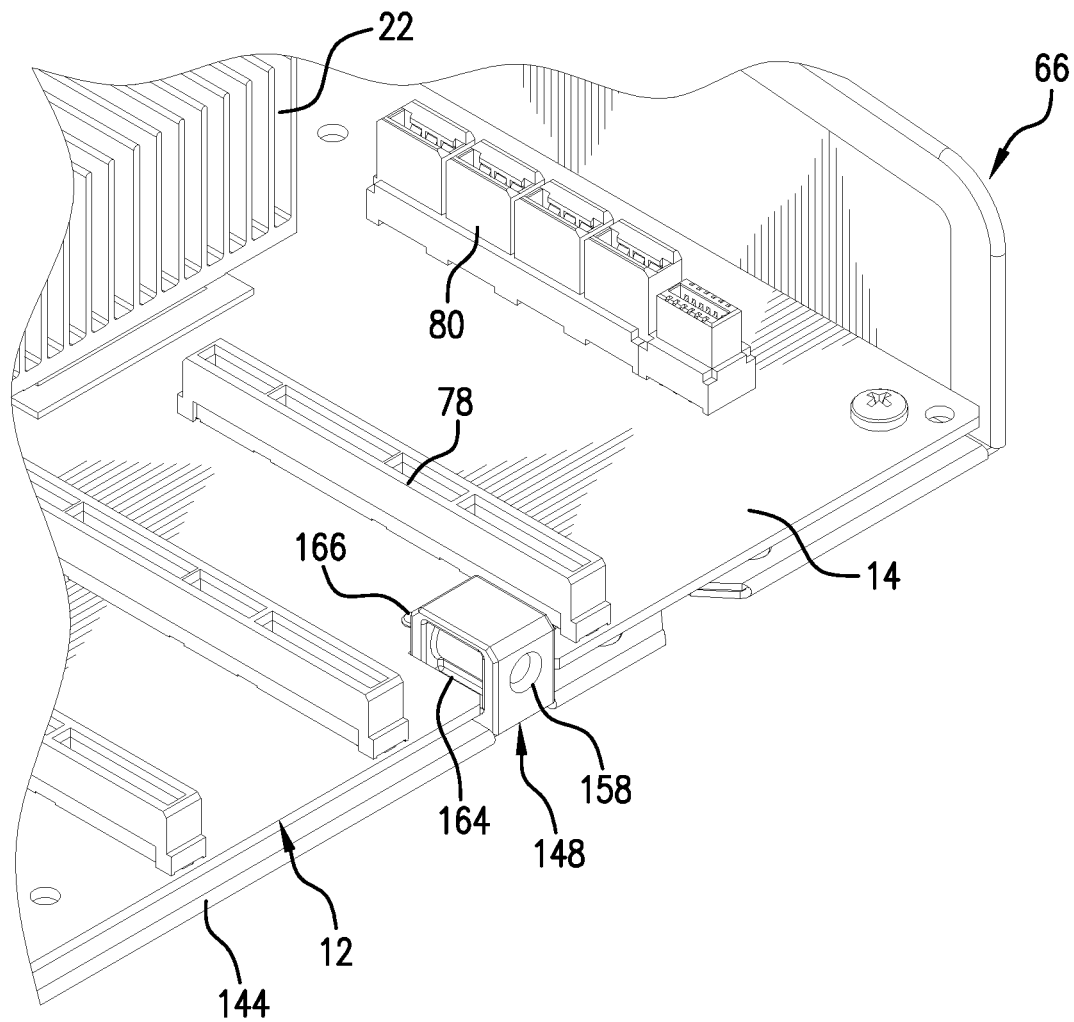
FIG. 21 is a partial, cut-away isometric view of the computing system shown in FIG. 3 illustrating alignment between the chassis and the CPU module.

FIG. 21 is a cut-away, isometric view of the canister 66 and the CPU module 12 showing how the guide blocks 148 also align the CPU module 12 to the canister 66 so that the connectors 90 are aligned with the I/O connectors 40. A tab 160 extends from the guide blocks 148 and includes a pin 162 that is coaxially aligned with the pin 152. The PCB 14 includes a slot 164 and a drilled hole 166, where the guide block 148 is positioned within the slot 164 and the pin 162 is positioned within the hole 166. The thickness of the tab 160 maintains the desired space between the PCB 14 and the plate 144.

Figure 22:
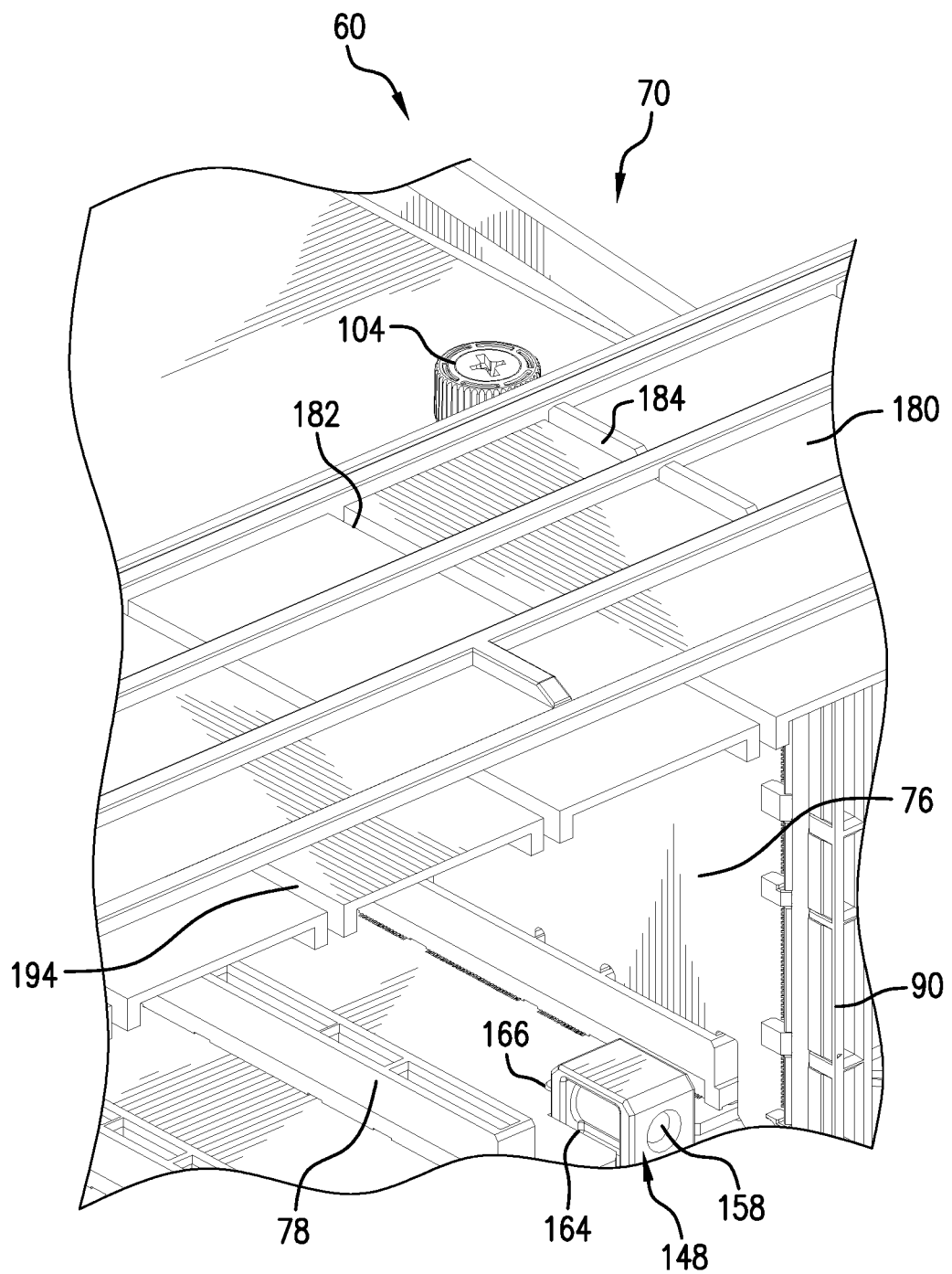
FIG. 22 is a partial, cut-away isometric view of the computing system shown in FIG. 3 illustrating the riser card engaging an air duct.

FIG. 22 is a partial, cut-away, isometric view of the system 60 showing that a top panel 180 of the air duct cover 70 includes slots 182 that capture tabs 184 extending from the top edge of the riser cards 76 so as to hold a top of the riser cards 76 in precise alignment.

Figure 23:
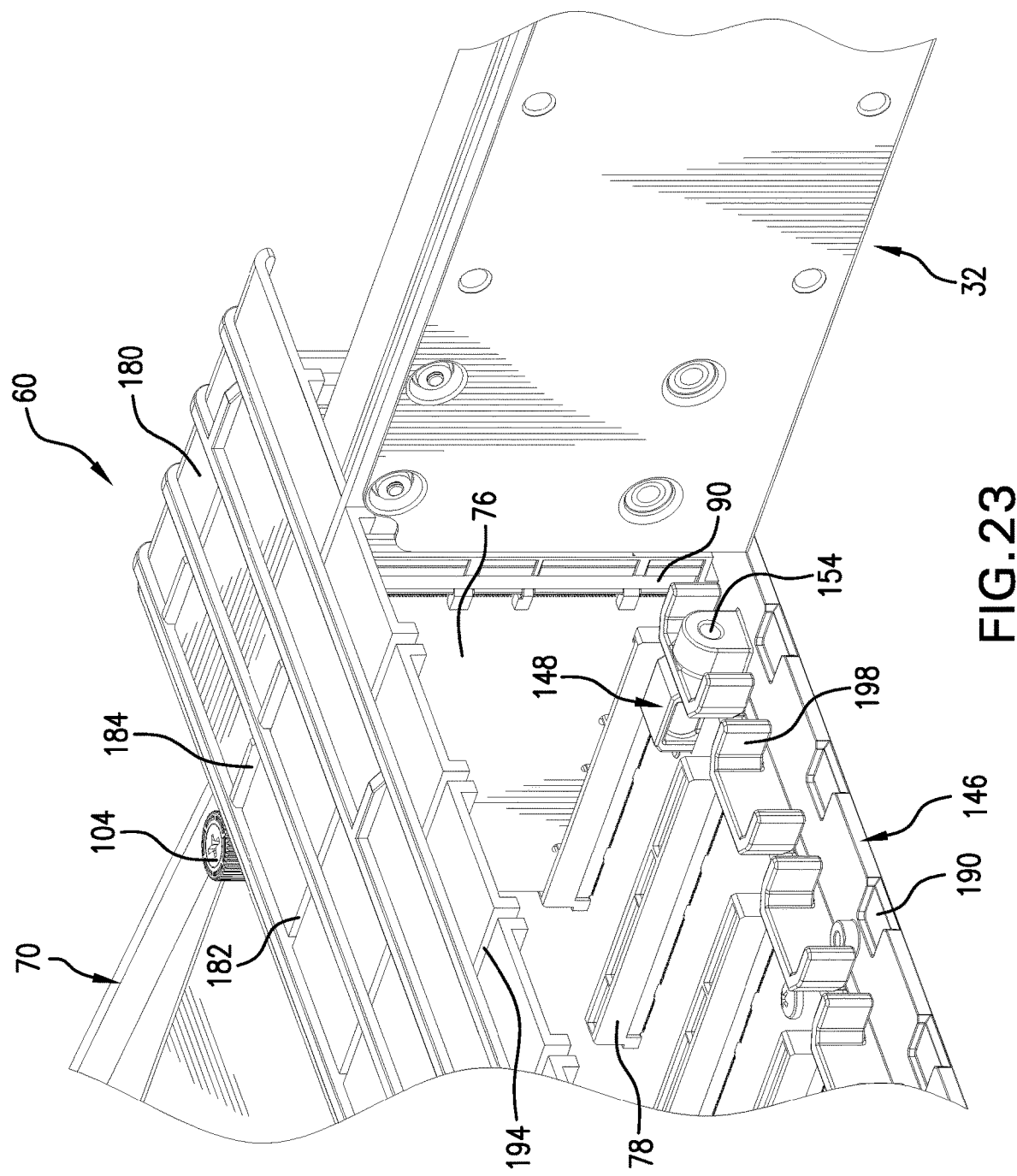
FIG. 23 is a partial, cut-away isometric view of the computing system shown in FIG. 3 illustrating one of the I/O modules being secured to the air duct and the guide rail.
Figure 24:
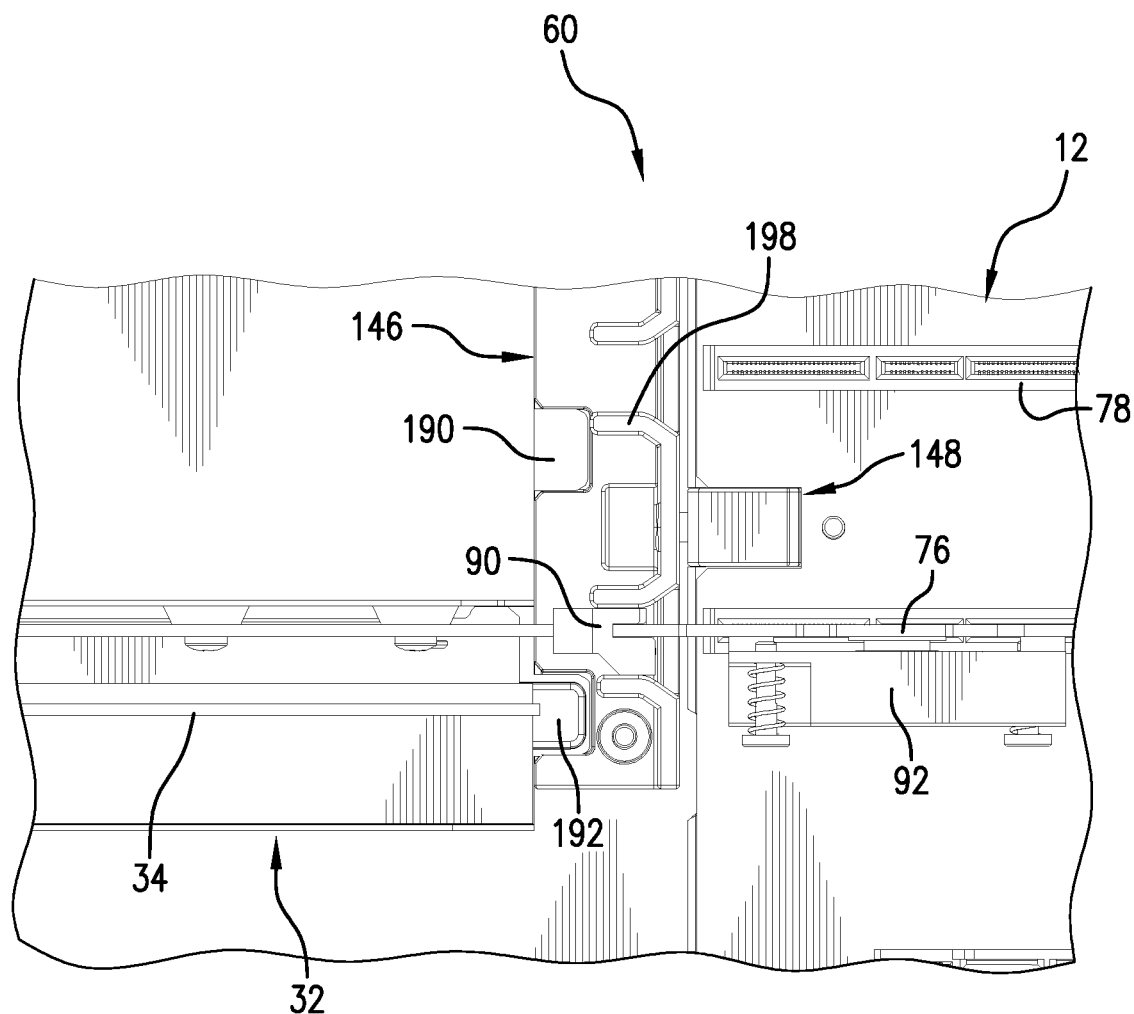
FIG. 24 is a top cut-away view of the computing system shown in FIG. 3 illustrating one of the I/O modules connected to the riser card.

FIG. 23 is a partial, cut-away, isometric view and FIG. 24 is a partial, cut-away, top view of the system 60 showing one of the I/O modules 32 being electrically connected to one of the riser cards 76. As shown, the guide bar 146 includes a series of depressions 190, one for each of the I/O modules 32, that each accept a tab 192 extending from the I/O module 32 and the top panel 180 includes slots 194 that accept the PCB 34 in the I/O module 32 so that the I/O module 32 is properly positioned. The guide bar 148 also includes a series of spacers 198 so that when the riser card 76 is connected to the connectors 78 on the PCB 14 and coupled to the air duct cover 70, the connector 90 is inserted and held between adjacent spacers 198, as shown. Thus, when the canister 66 is slid into the chassis 62, the connectors 40 and 90 are properly aligned and easily engage each other.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:
1. A computing system comprising:
a housing assembly including a chassis having a bottom panel and canister slidably insertable within the chassis, said canister including a bottom panel having a rear edge, said bottom panel of the canister including first and second angled slots that are open to the rear edge;
a central processing unit (CPU) mounted within the canister and including a plurality of first input/output (I/O) connectors;
a plurality of I/O modules positioned within the chassis, each I/O module including a second I/O connector;
a plurality of I/O riser cards each including a printed circuit board (PCB) having opposing side surfaces, a front edge, a rear edge, a top edge, a bottom edge, a third I/O connector coupled to the bottom edge and a fourth I/O connector coupled to the rear edge, wherein the third I/O connector on each I/O riser card is connected to one of the first I/O connectors and the fourth I/O connector on each I/O riser card is connected to one of the second I/O connectors so that the I/O riser cards are vertically oriented in parallel; and
first and second ejector levers pivotally mounted to the bottom panel of the chassis on first and second pins and being positioned between the bottom panels of the chassis and the canister, wherein actuation of the first and second levers cause the pins to move in the angled slots and the canister to slide relative to the chassis so as to connect and disconnect the second and fourth I/O connectors.

2. The system according to claim 1 wherein the first and second ejector levers are positioned within an embossed region of the bottom panel of the chassis.

3. The system according to claim 1 further comprising a first guide block mounted to the bottom panel of the canister proximate the first slot and having a hole, a second guide block mounted to the bottom panel of the canister proximate the second slot and having a hole, and a guide rail mounted to the bottom panel of the chassis proximate to the rear edge of the canister and having a first pin that engages the hole in the first guide block and a second pin that engages the hole in the second guide block.

4. The system according to claim 3 wherein the guide rail includes a series of orientation depressions where each depression accepts a tab on each I/O module.

5. The system according to claim 3 wherein the guide rail includes a series of spacer members defining spaces therebetween, and wherein the fourth I/O connector of each I/O module is positioned between adjacent spacer members.

6. The system according to claim 3 wherein the CPU module includes a first slot and a first hole proximate thereto and a second slot and a second hole proximate thereto and the first guide block includes a second pin coaxial with the first pin and the second guide block includes a second pin coaxial with the first pin, wherein the first guide block is positioned within the first slot and the second pin is positioned within the first hole and the second guide block is positioned within the second slot and the second pin is positioned within the second hole.

7. The system according to claim 6 wherein the first guide block includes a first tab and the second guide block includes a second tab where the first and second tabs are positioned between the bottom panel of the canister and the PCB module.

8. The system according to claim 1 further comprising an air duct cover secured to the canister, said air duct cover including alignment pins that engage and align with holes in the CPU module.

9. The system according to claim 8 wherein the air duct cover includes a series of alignment slots, and wherein the top edge of each of the I/O riser cards is inserted into at least one of the alignment slots and an edge of a PCB associated with each of the I/O modules is inserted into one of the alignment slots.

10. A computing system comprising:
a housing assembly including a chassis having a bottom panel and canister slidably insertable within the chassis, said canister including a bottom panel having a rear edge, said bottom panel of the canister including first and second angled slots that are open to the rear edge;
a central processing unit (CPU) mounted within the canister and including a plurality of first input/output (I/O) connectors;
a plurality of I/O modules positioned within the chassis, each I/O module including a second I/O connector;
a plurality of I/O riser cards each including a printed circuit board (PCB) having opposing side surfaces, a front edge, a rear edge, a top edge, a bottom edge, a third I/O connector coupled to the bottom edge and a fourth I/O connector coupled to the rear edge, wherein the third I/O connector on each I/O riser card is connected to one of the first I/O connectors and the fourth I/O connector on each I/O riser card is connected to one of the second I/O connectors so that the I/O riser cards are vertically oriented in parallel; and
a first guide block mounted to the bottom panel of the canister proximate the first slot and having a hole, a second guide block mounted to the bottom panel of the canister proximate the second slot and having a hole, and a guide rail mounted to the bottom panel of the chassis proximate to the rear edge of the canister and having a first pin that engages the hole in the first guide block and a second pin that engages the hole in the second guide block.

11. The system according to claim 10 wherein the guide rail includes a series of orientation depressions where each depression accepts a tab on each I/O module.

12. The system according to claim 10 wherein the guide rail includes a series of spacer members defining spaces therebetween, and wherein the fourth I/O connector of each I/O module is positioned between adjacent spacer members.

13. The system according to claim 10 wherein the CPU module includes a first slot and a first hole proximate thereto and a second slot and a second hole proximate thereto and the first guide block includes a second pin coaxial with the first pin and the second guide block includes a second pin coaxial with the first pin, wherein the first guide block is positioned within the first slot and the second pin is positioned within the first hole and the second guide block is positioned within the second slot and the second pin is positioned within the second hole.

14. The system according to claim 13 wherein the first guide block includes a first tab and the second guide block includes a second tab where the first and second tabs are positioned between the bottom panel of the canister and the PCB module.

15. The system according to claim 10 further comprising an air duct cover secured to the canister, said air duct cover including alignment pins that engage and align with holes in the CPU module.

16. The system according to claim 15 wherein the air duct cover includes a series of alignment slots, and wherein the top edge of each of the I/O riser cards is inserted into at least one of the alignment slots and an edge of a PCB associated with each of the I/O modules is inserted into one of the alignment slots.

17. A computing system comprising:
a housing assembly including a chassis having a bottom panel and canister slidably insertable within the chassis, said canister including a bottom panel having a rear edge, said bottom panel of the canister including first and second angled slots that are open to the rear edge;
a central processing unit (CPU) mounted within the canister and including a plurality of first input/output (I/O) connectors;
a plurality of I/O modules positioned within the chassis, each I/O module including a second I/O connector;
a plurality of I/O riser cards each including a printed circuit board (PCB) having opposing side surfaces, a front edge, a rear edge, a top edge, a bottom edge, a third I/O connector coupled to the bottom edge and a fourth I/O connector coupled to the rear edge, wherein the third I/O connector on each I/O riser card is connected to one of the first I/O connectors and the fourth I/O connector on each I/O riser card is connected to one of the second I/O connectors so that the I/O riser cards are vertically oriented in parallel;
first and second ejector levers pivotally mounted to the bottom panel of the chassis on first and second pins and being positioned between the bottom panels of the chassis and the canister, wherein actuation of the first and second levers cause the pins to move in the angled slots and the canister to slide relative to the chassis so as to connect and disconnect the second and fourth I/O connectors;

a first guide block mounted to the bottom panel of the canister proximate the first slot and having a hole, a second guide block mounted to the bottom panel of the canister proximate the second slot and having a hole, and a guide rail mounted to the bottom panel of the chassis proximate to the rear edge of the canister and having a first pin that engages the hole in the first guide block and a second pin that engages the hole in the second guide block, wherein the guide rail includes a series of orientation depressions where each depression accepts a tab on each I/O module, and wherein the CPU module includes a first slot and a first hole proximate thereto and a second slot and a second hole proximate thereto and the first guide block includes a second pin coaxial with the first pin and the second guide block includes a second pin coaxial with the first pin, wherein the first guide block is positioned within the first slot and the second pin is positioned within the first hole and the second guide block is positioned within the second slot and the second pin is positioned within the second hole, and wherein the first guide block includes a first tab and the second guide block includes a second tab where the first and second tabs are positioned between the bottom panel of the canister and the PCB module, wherein the guide rail includes a series of spacer members defining spaces therebetween, and wherein the fourth I/O connector of each I/O module is positioned between adjacent spacer members; and an air duct cover secured to the canister, said air duct cover including alignment pins that engage and align with holes in the CPU module, wherein the air duct cover includes a series of alignment slots, and wherein the top edge of each of the I/O riser cards is inserted into at least one of the alignment slots and an edge of a PCB associated with each of the I/O modules is inserted into one of the alignment slots.

18. The system according to claim 17 wherein the first and second ejector levers are positioned within an embossed region of the bottom panel of the chassis.

* * * * *